United States Patent [19]

Sanderson

[11] Patent Number: 5,608,328

[45] Date of Patent: Mar. 4, 1997

[54] METHOD AND APPARATUS FOR PIN-POINTING FAULTS IN ELECTRIC POWER LINES

[75] Inventor: John D. Sanderson, Portland, Oreg.

[73] Assignee: Radar Engineers, Portland, Oreg.

[21] Appl. No.: 342,173

[22] Filed: Nov. 18, 1994

[51] Int. Cl.$^6$ ................................................. G01R 31/02
[52] U.S. Cl. ........................ 324/529; 324/536; 324/133; 324/233; 324/521
[58] Field of Search ...................... 324/536, 529, 324/133, 521, 233, 102

[56] References Cited

U.S. PATENT DOCUMENTS

| | | |
|---|---|---|
| 3,539,922 | 11/1970 | Brockman . |
| 3,727,128 | 4/1973 | McFerrin . |
| 3,986,116 | 10/1976 | Smith ........................................ 324/133 |
| 4,063,171 | 12/1977 | Schweitzer ............................... 324/133 |
| 4,291,204 | 9/1981 | Crick . |
| 4,347,827 | 9/1982 | LoCascio . |
| 4,439,723 | 3/1984 | Loftness . |
| 4,446,420 | 5/1984 | Drouet ..................................... 324/536 |
| 4,475,079 | 10/1984 | Gale . |
| 4,491,782 | 1/1985 | Bellis et al. . |
| 4,585,997 | 4/1986 | Lin . |
| 4,609,866 | 9/1986 | Loftness . |
| 4,649,335 | 3/1987 | Lassaux et al. . |
| 4,766,549 | 8/1988 | Schweitzer, III et al. . |
| 4,859,951 | 8/1989 | Cole et al. . |
| 4,896,117 | 1/1990 | Floweredew et al. . |
| 4,929,903 | 5/1990 | Saigo ....................................... 324/536 |
| 5,029,118 | 7/1991 | Nakajima et al. . |
| 5,083,086 | 1/1992 | Steiner . |
| 5,185,686 | 2/1993 | Hansen .................................... 324/536 |
| 5,206,595 | 4/1993 | Wiggins et al. . |
| 5,352,984 | 10/1994 | Piesinger . |

FOREIGN PATENT DOCUMENTS

| | | |
|---|---|---|
| 203296 | 4/1956 | Australia . |
| 006005 | 12/1979 | European Pat. Off. . |
| 148674 | 7/1985 | European Pat. Off. . |
| 721777 | 3/1980 | U.S.S.R. . |
| 84911 | 7/1981 | U.S.S.R. . |
| 2082866 | 3/1982 | United Kingdom . |

OTHER PUBLICATIONS

Banker, W. A. et al., "Application of High Resolution Radar to Provide Non–Destructive Test Techniques for Locating URD Cable Faults and Splices", 1993 IEEE, pp. 1–7. (Month Unavailable).

Clegg, Barry, "Pin–Pointing," *Underground Cable Fault Location*, McGraw–Hill Book Company, 1993, Chapter 4, pp. 112–151. (Month Unavailable).

Clark, "Cancel 60 Hz and Other Noise," Electronic Design 20, Sep. 27, 1976, pp. 74–79.

(List continued on next page.)

Primary Examiner—Kenneth A. Wieder
Assistant Examiner—Jose M. Solis
Attorney, Agent, or Firm—Klarquist Sparkman Campbell Leigh & Whinston, LLP

[57] ABSTRACT

When a fault in an energized power distribution cable flashes over, the surge draws charge from both sides of the line. The fault thus produces a pair of current surges that propagate from the fault in opposite directions along the line. These oppositely-directed current surges create pulsed electromagnetic fields of different directions which, in turn, induce voltages of different polarities in a receiving antenna positioned along the line. The polarity of the first such voltage pulse induced in the antenna indicates the direction from the antenna to the fault. In one embodiment, the line is repeatedly "thumped," causing flashovers to recur at the fault. By moving the antenna along the line until the polarity of the initial received pulse inverts, the precise location of the fault can be determined. In another embodiment, direction-indicating fault current indicators according to the present invention are permanently placed at numerous locations in an operating AC power distribution system, in anticipation of a fault. When a fault occurs, the polarity of the first received electromagnetic fault pulse at each device indicates the respective direction from the device to the fault.

44 Claims, 5 Drawing Sheets

OTHER PUBLICATIONS

"Oak RF Interference Locator Model F-300," Oak Industries, Advertisement, 1977. (Month Unavailable).

"Model 700 Interference Locator," Sprague Engineering Bulletin No. 90033, Sprague Electric Company, 1979, 5 pages. (Month Unavailable).

Baker, E. E. Florida Power Corporation, "Fault Distance Indicator for URD Cable Circuits," IEEE/PES Transmission and Distribution Conference—Panel #29, Apr. 12, 1994, pp. 1–5.

Wiggins et al., "A Novel Concept for URD Cable Fault Location," 1993 IEEE, pp. 1–7. (Month Unavailable).

"Faulted Circuit Indicators," *KeyNotes*, brochure by Kearney, Jul., 1989, 7 pages.

"Pocket Size Magnetic Impulse Indicator Model MI-88," brochure by the VON Corporation, Mar., 1989, one page.

"Cable Fault Locator Used with any brand thumper," advertisement by Aqua-tronics, Inc. Northwest Public Power Bulletin, May, 1994, one page.

Weeks, Walter L. et al., "Above Ground Detection and Interpretation of Transient Signals on Underground Power Distribution Systems," 1994 IEEE, pp. 389–396. (Month Unavailable).

Steiner, J. P. et al., "An Automated Fault Locating System," 1991 IEEE, pp. 219–230. (Month Unavailable).

"Hotstick Line Sniffer Model 247," Radar Engineers, Oct., 1991, 2 pages.

Tarpey et al., "Non-Destructive, High Resolution Radar (HRR) System for Locating URD Faults and Splices", 91st ICC Meeting, Nov. 1992, Appendix XII–C–1—Appendix XII–C–16.

"Time–Domain Reflectometry for Monitoring Cable Changes Feasibility Study," Prepared by Purdue University, EPRI GS–6642, Project 2308–18 Final Report, Feb. 1990, 59 pages.

Widrow et al., "Adaptive Modeling and System Identification," *Adaptive Signal Processing*, Chapter 9, 1985, pp. 195–196. (Month Unavailable).

Komoda et al., "Development of a Current Detection Type Cable Fault Locator," Conference Record 90 WM 248-5 PWRD, IEEE Winter Power Meeting, Atlanta, Georgia, Feb., 1990, 5 pages.

Schwarz et al., "Fault Location in Underground Cable," IEEE PES Meeting, Jul. 1975, 3 pages.

Banker et al., "Application of High Resolution Radar to Provide Non-Destructive Test Techniques for Locating URD Cable Faults and Splices," 1993 IEEE, 7 pages. (Month Unavailable).

"Evaluation of Underground Fault Location Techniques," Prepared by The BDM Corporation, EPRI TD–153, Research Project 481–1, Final Report, Apr. 1976, 3 pages.

Steiner et al., Project 2895–1, EPRI EL–6765, Final Report, Prepared by Purdue University, Mar., 1990, pp. 6–13–7–3.

"PLI–150 Interference Locator System," Trilithic brocure, 2 pages, published prior to Nov. 18, 1994.

"Hand-held EMI/RFI Detector," ABN, Inc. Advertisement, one page, published prior to Nov. 18, 1994.

"Biddle Acoustic Impulse Detector," Cable Test Equipment—Power, AVO International, one page brochure, published prior to Nov. 18, 1994.

"HDW Digiphone Pinpointer," brochure by HDW Electronics, Inc., 2 pages, published prior to Nov. 18, 1994.

"Pinpoint the Source of R–F and TVI Noise with Little Snoop Interference Locator," Micro Tech Mfg. Inc., 4 pages, published prior to Nov. 18, 1994.

"The Super Snoop Will Pinpoint the Noise Source to the Exact Pole," Micro Tech Mfg. Inc., 2 pages, published prior to Nov. 18, 1994.

"DDF Defect Direction Finding Locator Model 237," Radar Engineers, 2 pages, published prior to Nov. 18, 1994.

"Sadelco Model FS 4–VU Signal Level Meter," Sadelco, Inc., 2 pages, published prior to Nov. 18, 1994.

"Vehicular Locating System for Radio/TV Interference," Radar Engineers, 2 pages, published prior to Nov. 18, 1994.

"Operations Manual Model 237 DDF Locator," Radar Engineers booklet, 20 pages, published prior to Nov. 18, 1994.

METHOD AND APPARATUS FOR PIN-POINTING FAULTS IN ELECTRIC POWER LINES

FIELD OF THE INVENTION

The present invention relates to the detection and location of faults in power distribution systems. More particularly, the invention relates to a method and apparatus for pin-pointing the location of faults in an underground cable by a fault direction sensing device.

BACKGROUND AND SUMMARY OF THE INVENTION

The problem of accurately determining the location of faults in underground cables (commonly termed "pin-pointing") has been studied for many years, resulting in a variety of proposed techniques. These methods generally rely on above-ground detection of one or more indicia, such as changes in voltage, current magnetic field, sound, or electromagnetic signals. Each of these methods has particular advantages and disadvantages, as noted below.

The most widespread methods for precisely locating faults in power cables are based on acoustic detection of an arc at the fault. Typically, a surge generator (sometimes termed a "thumper") is used to excite the cable with a series of high-energy pulses, which in turn prompt audible sparking and vibration at the fault. More particularly, a variable high-voltage D.C. source is connected to the cable through a high-voltage capacitor bank, with a timing circuit and solenoid- or thyristor-controlled switch to determine the voltage and rate of discharge.

When energy stored in the capacitor bank is discharged into the test cable, a high-voltage pulse travels down the cable towards the fault. This pulse typically has a steep leading edge and an exponentially decaying trailing edge. As the voltage at the fault rises, it eventually causes the fault to flash over, forming an ionized short between the two conductors. (The cable can be modelled as a distributed resistive/capacitive/inductive network, the time constants of which determine when the fault flashes over.)

The breakdown of the fault causes localized audio noise and/or vibration (sometimes termed a "thump"). However since the cable is buried, the sound is usually muffled so that a sensitive microphone and audio amplifier is often required for detection. In practice, the process of discharging and listening is typically repeated every few seconds while a technician slowly walks along the area under which the cable is buried.

Acoustic fault location suffers from a number of drawbacks. Primary among these is the simple difficulty of discerning the fault-induced "thumps" from other ambient noise, and accurately pin-pointing their origin along a buried cable. Echoes from rocks and other buried hard objects, for example, can readily produce misleading results. Media between the cable and the surface (e.g. plastic conduit, sandy soil, pavement) can effectively soundproof the cable. Yet another difficulty is the requirement of a highly skilled technician who is trained in the nuances of acoustic differentiation. (Electronic audio-based detectors are sometimes used in lieu of human locators, but are generally viewed as inferior to skilled human technicians.)

Another problem with acoustic detection techniques is that they rely on explosive arcs in order to produce sounds sufficiently loud to be detected above ground. To induce explosive arcing, the cable must be electrically abused with very large thumps, accelerating future failures of the cable.

While the discussion so far has focused on arcing faults, it should be noted that other types of faults, such as bolted faults and open faults, sometimes need to be located. Current practice with such faults is generally to abuse the cable sufficiently (e.g. by blasting or burning with repeated application of a large thumper voltage) that an arcing fault is finally produced, and then locate the arcing fault by traditional methods.

Another class of location techniques, albeit not suited for pinpointing, are those based on electromagnetic detection. In such systems, an operator moves a handheld electromagnetic detector along the buried cable, sensing the passage of large fault currents in the line below. Such techniques are generally used just to identify which of several lines has a fault.

Still another class of fault location methods is based on injection of an audio frequency signal into the cable, and its detection as it propagates along the cable.

More sophisticated than the foregoing techniques, and commensurately more complex, is arc reflection time-domain reflectometry (TDR). This technique induces an arc at the fault (i.e. by a surge generator connected at one end of the cable), and then introduces a series of brief, lower voltage pulses into the cable. These pulses encounter a transmission line discontinuity at the arc and reflect back to their origin where they are detected. By knowing the speed at which signals travel along the cable (the velocity factor), and by measuring the time it takes a pulse to make the round-trip, the distance to the fault can be determined.

The accuracy of arc reflection TDR is limited by the accuracy of the a priori information. For example, a small difference in the actual versus estimated velocity factor of the cable can result in a one to two percent difference between the best TDR estimate and the actual location of the fault. For a cable length of only 1000 feet this difference could be up to 20 feet. Further, there is often a difference between the distance measured above ground and the distance actually traversed by the cable, which leads to other inaccuracies—even ignoring uncertainty due to cable velocity factor. Therefore, the use of the arc reflection TDR method is limited to gross location of the faults (sometimes termed "pre-location"), after which a more accurate method must be used for pin-pointing the fault location.

Another difficulty with TDR systems arises when troubleshooting a complex cable system containing many branches and other connections (as is often the case in practical application). In such cases the reflected waveforms can become very difficult—if not impossible—to analyze.

To help alleviate this latter problem, and to assist in fault location generally, power distribution systems typically include devices known as Fault Current Indicators (FCIs) at periodic spacings to indicate whether a fault current passed that point in the distribution system. By analyzing data from the FCIs in a given system, it is sometimes possible to identify a particular length of cable suspected to contain the fault. By isolating this cable from the rest of the network, TDR techniques can be used more successfully to pinpoint a fault. (Uncertainties due to velocity factor and above/below ground path differences remain.) FCI data, however, is generated by actual network power distribution (i.e. 60 Hz power), rather than thumper signal. To adequately localize a fault with FCIs so that TDR data can be effectively used often requires repeated full-power energization of the faulty network (i.e. reclosure of protective breakers or fuses), causing undesirable stress and wear on the system.

To more fully appreciate the background of the present invention, it is appropriate to turn from consideration of what artisans have done in this field to what they are doing.

For the past several years, and for the foreseeable future, the technologies that have captured the interest of artisans in this field are those based on digital signal processing- (DSP) and microprocessor-based analyses. With the advent of powerful, off-the-shelf DSP chips, engineers are able to apply tremendous computing resources to the task of fault location, readily applying numerical analysis techniques that were out of the question a few years earlier.

One such technique involves use of a thumper to excite a faulty cable. When the fault occurs, pulses propagating along the line reflect from the fault, causing the cable to ring with a plurality of superimposed waveforms. Previously, the resultant waveform was too complex to be used directly to show the fault location. Now, however, the pattern of ringing can be mathematically processed and analyzed to discern the approximate fault location that would produce that characteristic pattern.

While these mathematical model-based techniques hold great promise, they also have their drawbacks. In addition to the obvious concerns about cost and complexity, these systems rely on acquisition of data from the cable at a point remote from the fault. Thus, these systems must identify the location of a fault in terms of its spacing from the measurement point. However, as noted earlier, such calculations must be premised on knowledge of the cable's velocity factor, and if this number is in error by only a percent or two, the analysis will fail to provide the desired pinpointing information.

It is an object of the present invention to provide a fault pinpointing system that overcomes certain of these drawbacks of the prior art. In many embodiments of the invention, this is achieved by identifying a direction to the fault from a present location.

In a first exemplary embodiment, a surge generator is connected to one end of the cable and injects a high-energy pulse ("incident pulse") into the cable. After a brief interval (during which the pulse may propagate back and forth along the cable a few times), the pulse causes the fault to arc over, generating a pair of fault current surges that travel away from the fault in opposite directions.

A receiving device, including an electromagnetic detector (e.g. a loop antenna) and discrimination circuitry, detects the initial polarity of the resulting electromagnetic pulse and provides a corresponding indication to an operator. From this polarity indication, the operator knows the direction to the fault. By moving the receiving device along the path of the buried cable until the polarity indicator detects a change in polarity, the fault can be precisely located.

More particularly, the pair of initial steep, rising edges of the fault surges induce voltage pulses of opposite polarity in the loop antenna, because they are physically travelling in opposite directions. Ignoring the incident pulse and its reflections, the initial steep, rising edges of the pair of fault surges are the first electromagnetic events that occur after the fault breaks down. Thus, regardless of the complexity of the cable system and how many later reflections of the incident pulse and fault pulse surges occur, the polarity of the first fault surge detected by the receiver indicates the direction from the receiving device to the fault.

It should be recognized that devices according to the present invention can make their direction determination from a variety of different excitation signals—not just thumper signals. Other suitable signals include AC power, AC test, and DC test signals.

One advantageous application of applicant's invention is as a direction-indicating FCI. Such devices can be permanently installed at spaced locations in a power distribution system and—in the event of a fault—indicate to technicians the directions to the fault from each respective device. Instead of relying on thumpers, such devices work with the normal AC power signals.

In other embodiments, a fault-direction detection device according to the present invention can be combined with cable tracer for simultaneously tracing the path of the cable under test. In yet other embodiments, a fault-direction detection device can be combined with a time-domain reflectometer (pulse echo device) for prelocating the fault. In still other embodiments, a fault detection device can be combined with acoustic detectors or prior art electromagnetic sensors.

It will be recognized that prior art pin-pointing techniques have failed to appreciate that the polarity of an electromagnetic pulse generated by a fault current can be used to determine the direction to the fault. The present invention exploits this principle and provides a low cost technology for quickly and accurately pinpointing buried cable faults.

The foregoing and additional features and advantages of the present invention will be more readily apparent from the following detailed description, which proceeds with reference to the accompanying drawings.

DETAILED DESCRIPTION OF THE PREFERRED EMBODIMENTS

Figure 1:
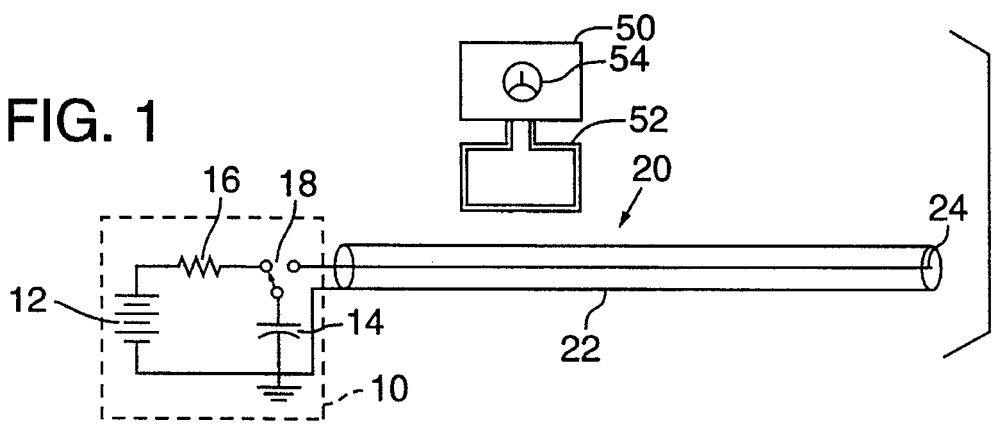
FIG. 1 is a functional block diagram of an apparatus according to one embodiment of the present invention.

Referring to FIG. 1, an exemplary embodiment of an apparatus 5 for pin-pointing the location of faults in cable and cable systems includes a current source ("thumper") 10 connected to one end of a cable 20. The cable typically includes a core conductor 24 and an unjacketed concentric neutral 22. Apparatus 5 also includes a receiving device 50 having an electromagnetic sensor 52 (e.g. a loop antenna or pickup coil) and a direction indicator 54. Current source 10 can includes a battery 12, a capacitor 14, a resistor 16 and a timing switch 18, as is known in the prior art.

With timing switch 18 positioned for charging, as shown in FIG. 1, capacitor 14 is connected across the terminals of battery 12 through resistor 16. This allows current to flow from battery 12 through resistor 16 to charge capacitor 14. The voltage across capacitor 14 rises rapidly at first, gradually approaching the rated voltage of battery 12 as the charging time is reached. The actual charging time depends both on the capacitance of capacitor 14 and the resistance 16, with the capacitance typically selected to provide a constant energy output over a range of applied voltages.

Figure 2:
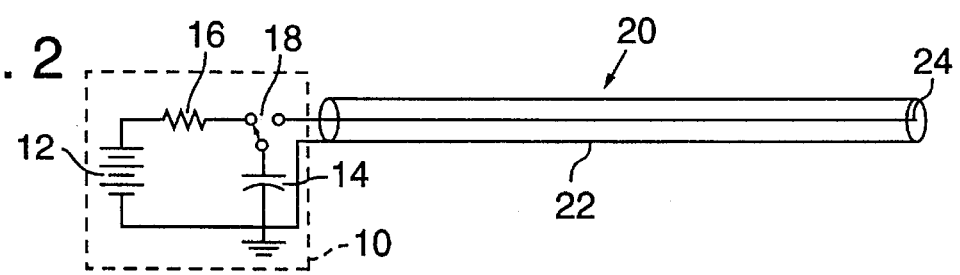
FIG. 2 is an excerpt of FIG. 1, used to facilitate understanding of FIG. 3.
Figure 3:
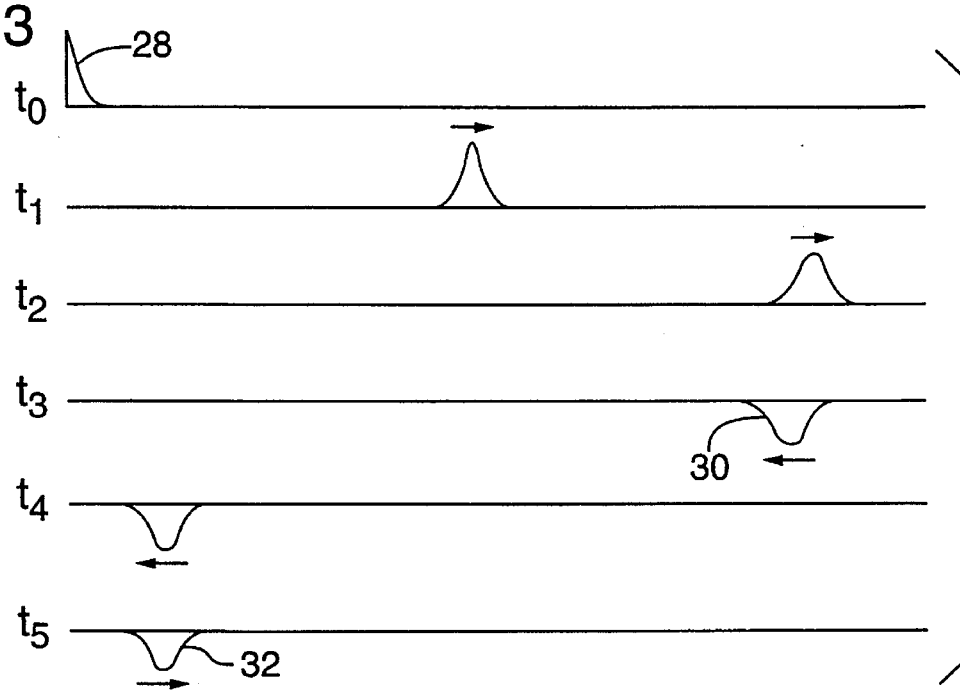
FIG. 3 is a time domain graph illustrating the time evolution a high-energy current pulse traveling in the cable of FIG. 2.

Referring now to FIGS. 2 and 3, after capacitor 14 has been charged to its maximum value, timing switch 18 is positioned to allow rapid discharging of capacitor 14 into cable 20. As shown in FIG. 3, a typical incident current pulse 28 is generated by the rapid discharging of capacitor bank 14 into cable 20. This incident current pulse 28 travels along cable 20 in a first direction until the pulse reaches the far (open) end of cable 20. There it is reflected, and the reflected pulse 30 and travels back along the cable in the opposite direction. (Voltage pulses reverse polarity at short circuits. Current pulses reverse polarity at open circuits.)

When reflected pulse 30 reaches the source end of cable 20, the pulse is again reflected and generates re-reflected pulse 32 which travels along cable 20 in the first direction. (The polarity of the re-reflected pulse 32 depends on the impedance presented by the thumper source 10. In the illustrated embodiment, no polarity inversion occurs at the source.) The process of reflection and re-reflection continues until the energy of the reflected pulses is completely dissipated by resistive losses in the cable.

Figure 4:
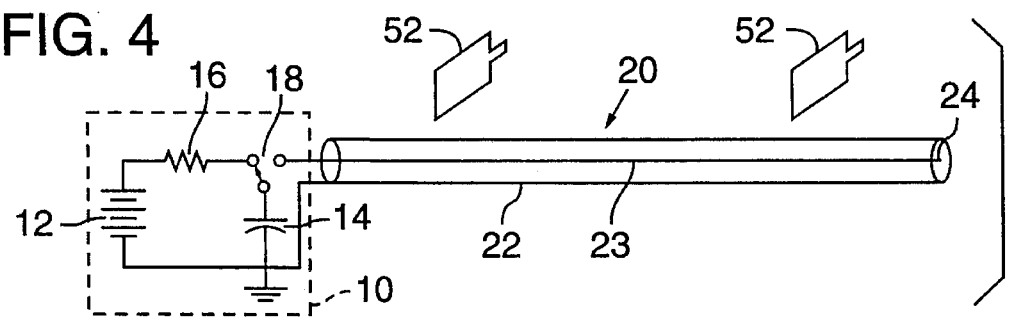
FIGS. 4 and 5 correspond to FIGS. 2 and 3, but show the situation when the cable includes a fault.
Figure 5:
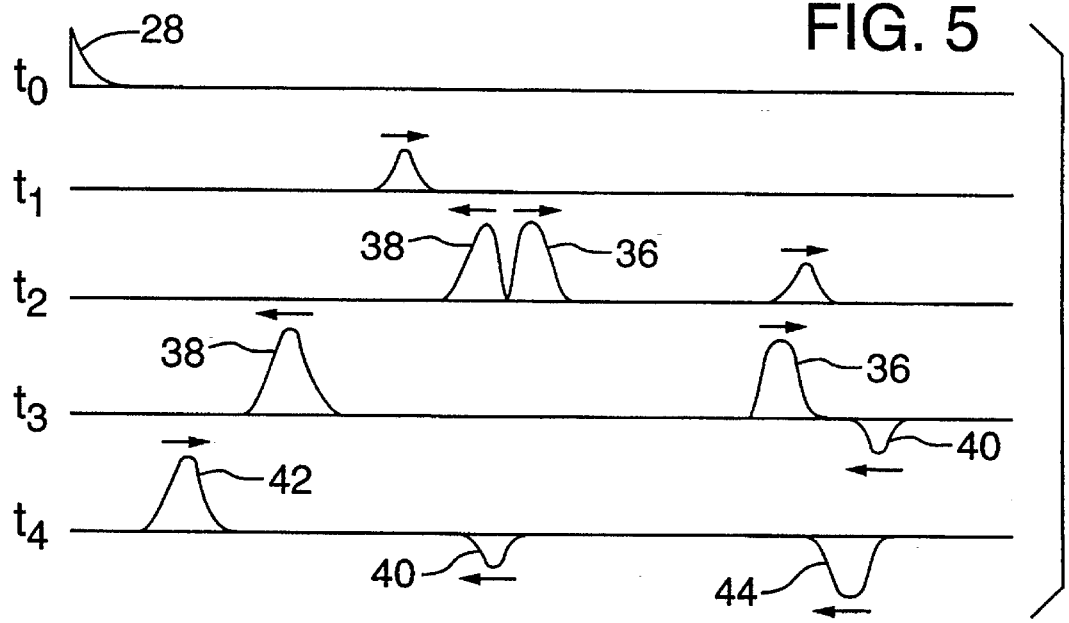

Referring to FIGS. 4 and 5, thumper 10 is again connected to one end of cable 20. However, cable 20 now includes a fault 23 between the center conductor 24 and the metal sheath 22. An incident pulse 28 is again generated by the rapid discharging of capacitor bank 14 into cable 20. Again, the pulse propagates along the line, and reflects alternately off one end and then off the other. Eventually, a sufficient voltage builds up at the fault location 23 to cause a flashover, with a surge of current passing from the center conductor to the neutral conductor and ground.

The surge of current across the fault is supplied by both the left and right hand sides of the charged center conductor. Thus, a pair of current surges are produced, which propagate away from the fault in opposite directions.

FIG. 5 is a timing diagram which illustrates this phenomenon. The initial thumper pulse is shown at time $t_0$. After, perhaps several round trips back and forth along the line (not shown), a pulse approaches the fault location (time $t_1$). An instant before time $t_2$, the flashover occurs. This flashover draws a surge of current from both sides of center conductor 24, which is manifested as a pair of current pulses 36, 38 propagating away from the fault (time $t_3$).

These fault current pulses, themselves, reflect at impedance discontinuities, such as at the open end of the line 20 to the right in FIG. 5, and at the current generator 10 at the left. Further, the fault current pulses also reflect when they return to the arcing fault location 23. (The fault—once ionized and bridged by an arc of electrons, continues as a short circuit for a significant period following the initial flashover surge.) Thus, as long as the arcing continues, fault surges 36 and 38 reflect back and forth on their respective sides of cable 20.

As is familiar to those skilled in the art, the motion of electrons as an electric current produces a corresponding electromagnetic field, the direction of which depends on the direction of current flow according to the "right hand rule."

The two fault current pulses thus each produce their own oppositely-directed electromagnetic fields. These oppositely-directed electromagnetic fields, in turn, induce oppositely directed currents to flow in the loop antenna 52, producing voltage pulses of opposite polarities at the antenna terminals.

(It should be noted that, if all of the surge current returned over the concentric neutral conductor, the oppositely directed currents in the line and in the neutral conductor would produce electromagnetic fields that substantially cancel in the far field. It is due to imbalance between the currents in these conductors (i.e. the presence of currents seeking other return paths, such as through earth ground), that the surge current produces a detectable electromagnetic field. In distribution systems employing jacketed neutral conductors, a more sensitive detector may need to be employed since the currents in the hot and neutral conductors will more nearly balance.)

If the loop antenna 52 is between the thumper and the fault (the plane of the antenna being oriented perpendicular to the cable), the first electromagnetic field it encounters (ignoring the initial thumper pulse) is the one induced by pulse 38 travelling to the left. This produces a corresponding voltage pulse of a given polarity at the antenna output.

If, however, the loop antenna is between the fault and the open cable end, the first electromagnetic field it encounters is the one induced by pulse 36 travelling to the right. This current, being directed oppositely to current 38, produces a voltage pulse opposite in polarity to the pulse noted in the previous paragraph.

Thus, by detecting the polarity of the antenna signal produced by the first fault current surge, the direction from the antenna to the fault can be identified. This polarity is indicated on the receiver 50 by the indicator 54, which can be a zero-center meter, an LCD display, etc.

(If the thumper pulse is positive, the polarity of the electromagnetic pulse seen by the detecting device will be positive on the thumper side of the fault, and negative on the far side. This polarity difference is inherent in the fact that the fault surge travels away from the fault in both directions.)

Figure 6:
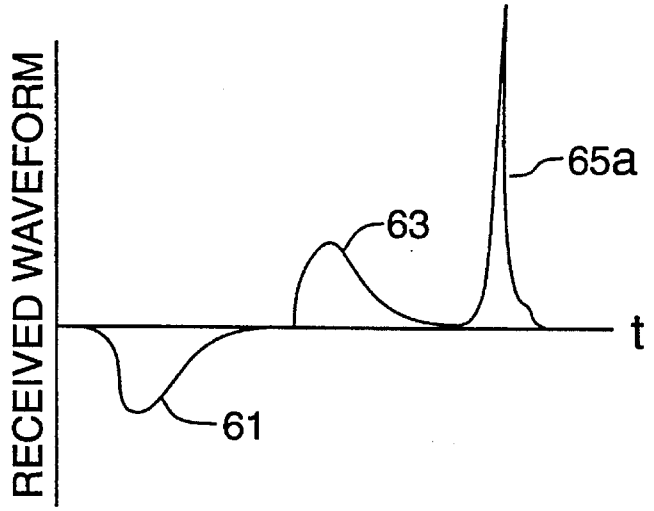
FIGS. 6 and 7 show a voltage signal presented by an antenna to a receiving device according to one embodiment of the invention.
Figure 7:
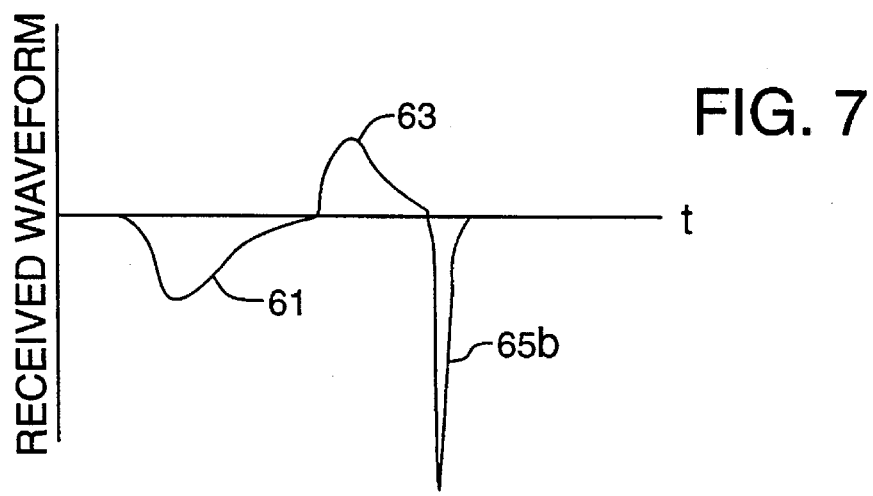

FIGS. 6 and 7 show the voltage signal provided from the antenna 52 when positioned on the left (FIG. 7) and on the right (FIG. 6) sides of the fault 23. The antenna at both positions senses the propagation of the initial thumper pulse 61. In both, the direction of the pulse propagation appears to be the same (i.e. rightward), so a voltage pulse of the same polarity is produced in the antenna at both locations. Next, the antenna senses the propagation of the reflected thumper pulse 63. Again, at both antenna locations the pulse appears to be travelling in the same direction (i.e. leftward), so voltage signals of the same polarity are produced.

When flashover of the fault occurs, fault current pulses 36 and 38 begin propagating in opposite directions. Pulse 38, which is propagating leftward, produces a large positive transient voltage 65a in an antenna positioned to the left of the fault (FIG. 6). Pulse 36, which is propagating rightward, produces a large negative transient voltage 65b in an antenna positioned to the right of the fault (FIG. 7).

Additional pulses are thereafter received by each antenna. However, the direction to the fault is known from the polarity of the first surge pulse, so later pulses can be ignored.

To locate a buried fault, a technician walks along the line with the receiver 50, while a thumper repeatedly produces flashovers at the fault. Along one section of the line, each flashover causes surge currents that induce a voltage of the same initial polarity in the antenna 52. As the technician continues to walk along the line, however, a location will be reached at which the flashover surge currents induce a voltage of the opposite polarity. The technician's physical location when the polarity of the initial surge pulse changes is the location of the fault.

In some circumstances, at locations very close to the fault, the pulses from the two oppositely-directed currents may be received in such close succession as to tend to cancel each other. In such circumstances, this substantial absence of a received fault pulse can be used to indicate the precise position of the fault. (In such circumstances, care should be taken not to mistake the reflection of one of the fault current surges off the nearest end of the cable as the desired pulse.)

Use of this polarity phenomenon greatly simplifies the problem of locating a fault. The fact that the incident pulse and the fault surges propagate and reflect back and forth throughout the whole system, regardless of the fault location, is no longer a problem. One only has to detect the polarity of the first fault surge that passes the sensor to know in which direction the fault lies. This approach also gives data not available from conventional state of the art FCIs: it not only shows if a current surge occurred, but also the direction from which it came.

Discriminator

The problem of determining the direction to fault 23 thus reduces to the problem of detecting the first fault surge that reached receiving device 50 after the arcing at fault 23 occurs. This requires discriminating between incident pulse 28 and fault surges 36 and 38. In order to discriminate between incident pulse 28 and fault surges 36 and 38, both amplitude and/or frequency methods can be used. Amplitude discrimination relies on the fact that the impedance of the arc at fault 23 is typically lower than the characteristic impedance of cable 20. Therefore, instantaneous fault surges 36 and 38 will usually have peak values several times greater than that of incident pulse 28. (The magnitude of the incident current pulse is approximately $V_{thumper}/Z_0$, whereas the magnitude of the fault current pulse is $(V_{fault}/Z_{fault})$, where $V_{thumber}$ is the thump voltage, $Z_0$ is the characteristic impedance of the cable, $V_{fault}$ is the voltage at the fault at the instant of breakdown (approximately equalling $V_{thumper}$, and $Z_{fault}$ is the impedance of the arc current path.)

Frequency discrimination relies on the fact that cable 20 acts as a low-pass filter which attenuates the high frequency components of incident pulse 28 (due to its distributed capacitive and inductive effects). By contrast, near fault 23 the high frequency components of fault surges 36 and 38 are usually much more pronounced. A filter in the receiving device can thus be used to discriminate between the two types of pulses. Further, the antenna is typically more sensitive to high frequency signals. In the preferred embodiment, a combination of amplitude and frequency discrimination is used to accurately detect the first of fault surges 36 or 38.

Figure 8:
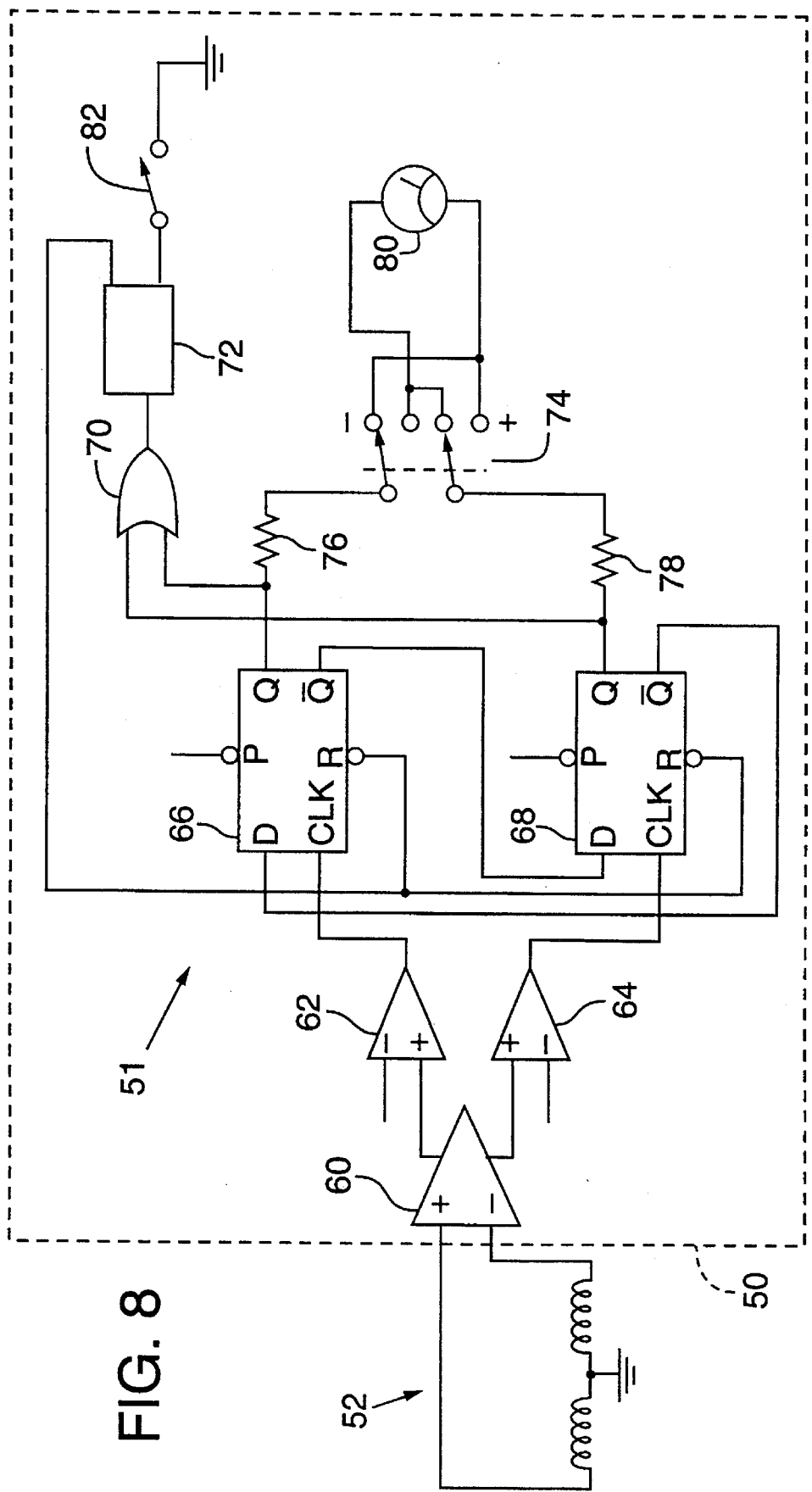
FIG. 8 is a simplified schematic diagram of a detection circuit for determining the polarity of a fault pulse.

Continuing with FIG. 8, a simplified schematic diagram of a detection circuit 51 of receiving device 50 is shown. As shown in FIG. 8, detection circuit 51 includes a high frequency differential amplifier 60, a pair of high speed comparators 62 and 64, a pair of "D" flip-flops 66 and 68, resistors 76 and 78, "OR" gate 70, timer 72, reset switch 82, polarity switch 74 and indicator 80. High frequency amplifier 60 receives the induced current from antenna 52 and drives the inputs to the comparators 62 and 64. If the induced current is positive, then flip-flop 66 is clocked on, which drives indicator 80 in a first direction through resistor 76. Conversely, if the induced current is negative, then flip-flop 68 is clocked on, which drives indicator 80 in a second direction through resistor 78.

Switch 74 is used to select for the polarity of incident pulse 28 provided by current source 10. For example, if incident pulse 28 is positive then switch 74 is set in the positive position shown in FIG. 8. Similarly, if incident pulse 28 is negative, then switch 74 is set in the negative position. Finally, if either flip-flop 66 or 68 is set and reset switch 82 is open, then timer 72 will reset the flip-flop after about one second thereby turning indicator 80 off, and resetting the circuit to respond to the next thump.

Direction-Indicating FCI

One advantageous application of the present invention is as a direction-indicating FCI. Devices 50 can be permanently established at fixed positions in a power distribution system, and can sense electromagnetic pulses produced by AC power fault currents. This sensed data can be stored, or relayed to a central monitoring station, for use in indicating the direction to faults. (With an AC excitation voltage, such devices also need to monitor the instantaneous polarity of the AC waveform in order to discern the direction to the fault from the polarity of the initial surge pulse. If the AC signal has one polarity, a positive initial pulse at the antenna terminals means the fault is to the right; if the AC signal has the opposite instantaneous polarity, a positive initial pulse means the fault is to the left.)

Direction-indicating FCIs represent a substantial improvement to existing FCI technology. Instead of simply memorializing passage of a fault current, FCIs according to the present invention indicate the direction from which the fault current came. Repeated reclosure of system breakers to localize the fault is thus not required, saving system components the abuse associated with prior art techniques. The direction indicating feature also allows faults to be located more quickly, with an attendant reduction in the time required to repair the fault and return the system to service.

Fault Locating Integrator

In accordance with another embodiment of the invention, current integration can be used in fault location.

Consider the case of an arcing fault on an energized cable (energized with a DC thump pulse). Between the power source and the fault, there is substantial DC current flow; on the far side of the fault there is zero DC, even though the surge currents are quite high. By detecting the current magnitude along a line in an arcing condition, the fault can be located as the point at which the magnitude of the current integral changes suddenly.

An antenna having its output coupled to an integrator can be used as a detector in this application. Assume the line is driven with a thumper pulse. When the detector is positioned between the thumper and the arcing fault, it measures the integral of the incident thumper current, which is much greater than if the detector were positioned on the far side of the fault. Again, a plurality of such detectors can be permanently installed in a power distribution system, in the manner FCIs are presently deployed.

(While an antenna is shown in the illustrated embodiments, other electromagnetic detectors can be used. Hall effect, magneto-resistive and magneto-restrictive devices are suitable alternatives. Indeed, in many applications, such devices are preferable. While an antenna is responsive to the derivative of current (the antenna senses electromagnetic fields, which are produced by changes in current), some of these other devices provide output signals that are proportional to current itself.)

Figure 9:
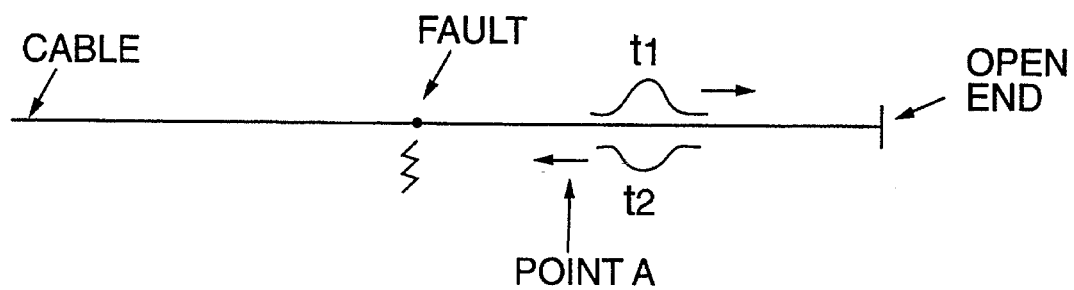
FIG. 9 is a diagram used in explaining an integrating fault locating device.

Conventional FCIs trigger when they sense a high current. But when a system is excited with a thumper pulse, currents surge up and down the cable, both from the incident pulse (thump) and from the fault surges. These high peak currents appear on both sides of the fault. Referring to FIG. 9, and ignoring resistive attenuation of the pulse between $t_1$ and $t_2$, if the current passing point A is integrated over a period including $t_1$ and $t_2$, the integral would tend to be zero. This is true for the fault surges as well as for the incident pulse.

Figure 10:
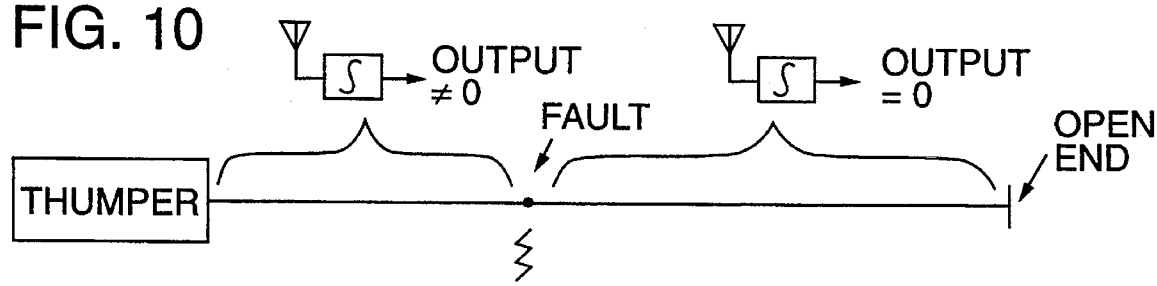
FIG. 10 is a companion diagram to FIG. 9, used in explaining an integrating fault locating device.

Once the fault breaks down, the thumper dumps lots of current into the thumper-fault side of the cable. The integral of the current on the thumper-fault side doesn't tend towards zero. (FIG. 10).

The integration operation allows this arrangement to operate with a thumper, i.e. in the presence of high peak currents that are not indications of a fault.

The integrator can be implemented in a number of known ways, from a simple galvanometer, to sophisticated integrating networks employing IC circuitry.

Open Fault Location

Figure 11:
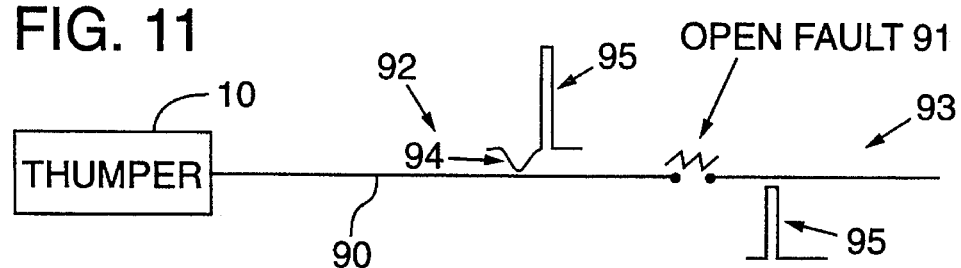
FIG. 11 shows a line having an open fault.

A variant of the present invention also finds applicability in locating open faults (i.e. breaks in the cable conductor). With reference to FIG. 11, a thumper 10 is connected to one end of a cable 90 having an open 91 therein. A thumper pulse applied to the left side 92 of the cable oscillates back and forth between the thumper 10 and the open 91, with the polarity of the thumper current inverting at each reflection. Eventually, breakdown occurs and an arc jumps across the open to the right side 93 of the cable. On the left side 92 of the cable, there are thus two currents: the oscillation of the initial thumper pulse 94, and the eventual arc current pulse 95. On the right side 93 there is just the arc current pulse 95.

The apparatus shown in FIG. 1 is ineffective in locating such faults, since the fault surge propagates in just one direction. However, the two sides of the fault can be distinguished by the presence (or absence) of the thumper pulse with the arc pulse.

The amplitude- and frequency-discrimination techniques described above can be used to discern the arc pulse from the thumper pulse and its reflections. The antenna/integrator sensor described above can sense the presence (or absence) of the incident pulse.

Figure 12:
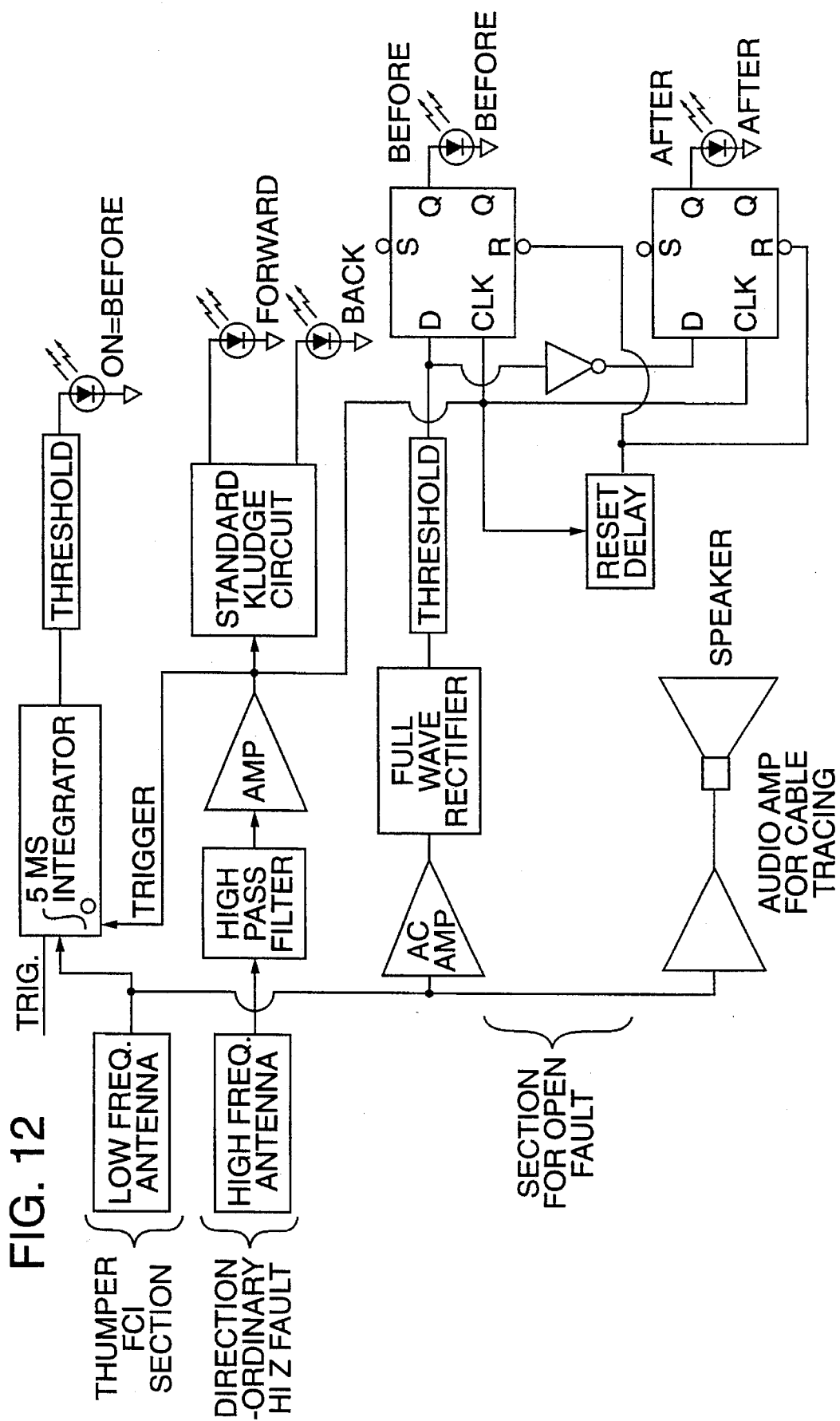
FIG. 12 shows a device according to an embodiment of the present invention for locating open faults.

If incident pulse current is present at the time the arc surge is detected, the detector is positioned over the portion 92 of the cable between the thumper and the fault. Conversely, if the incident pulse current is not present, then the detector is over the portion 93 of the cable beyond the open fault. A schematic block diagram illustrating a detector embodying this location technique is shown in FIG. 12. (The illustrated "Standard Kludge Circuit" can be similar to that shown in FIG. 8.)

Concluding Remarks

Figure 13:
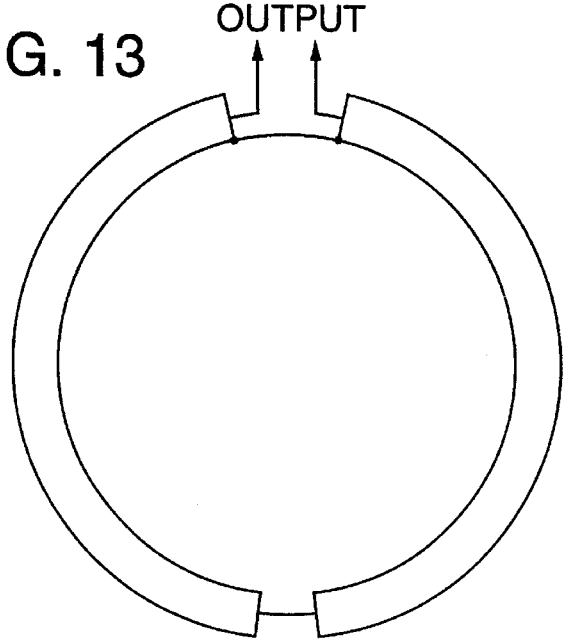
FIG. 13 shows an antenna which can be used in embodiments of the present invention.

It will be recognized that the magnetic field sensor used in devices according to the present invention can take many different forms, such as an antenna, Hall effect device, or devices employing magneto-resistive or magneto-restrictive effects, depending on the particular applications in which they are used. For portable embodiments (e.g. for use by a technician walking along a buried line), the antenna can be a coax shielded loop antenna, about six inches in diameter, as shown in FIG. 13. In fixed FCI applications, the antenna can be a loop around the cable, or can be located at some distance from it. Of course, a variety of antenna topologies other than loops can also be employed.

A variety of other approaches to fault location employing principles of the present invention can also be employed. For example, the invention can be used after prelocation performed with arc reflection or other prelocating procedure. In such case, the search begins at an indicated prelocation site.

Having described and illustrated the principles of my invention with reference to various illustrative embodiments, it will be apparent that the detailed embodiments can be modified in arrangement and detail without departing from such principles. For example, the techniques of the present invention can advantageously be combined with other known techniques, to enhance their performance. For example, known prelocation techniques can be used to define a starting point from which the present invention can thereafter be used to pinpoint a fault.

In view of the wide variety of embodiments to which the principles of my invention can be applied, it should be apparent that the detailed embodiments are illustrative only and should not be taken as limiting the scope of my invention. Rather, I claim as my invention all such modifications as may come within the scope and spirit of the following claims and equivalents thereto.

I claim:

1. An apparatus for locating an arcing fault in a cable from a position spaced from the cable, the apparatus comprising:

an electromagnetic field detector including means operative remotely from the cable for detecting and discriminating an electromagnetic field associated with high current fast rise time pulses that emanate from an arcing fault and for producing a signal responsive to said field, the detector further including means for detecting the polarity of said signal, said polarity indicating the direction of the fault in relation to the location of the said electromagnetic field detector, wherein the apparatus can locate arcing cable faults without physical coupling of the electromagnetic field detector to the cable.

2. The apparatus of claim 1 wherein said electromagnetic field detector includes a sensor selected from the group consisting of a Hall effect device, a magneto-resistive device, and a magneto-restrictive device.

3. The apparatus of claim 1 which further includes means for deliberately applying a high voltage signal to the cable to cause the fault to arc.

4. The apparatus of claim 1 which further includes means for applying a normal rated operating voltage of the cable at the normal operating frequency, said applied normal rated operating voltage causing the fault to arc.

5. The apparatus of claim 1 which further includes means for applying a DC voltage to the cable to cause the fault to arc.

6. The apparatus of claim 1 which further includes means for applying an AC test voltage to the cable to cause the fault to arc.

7. A method of locating a fault along a power transmission line comprising:

isolating the transmission line from a power distribution system of which the line is usually a part;

providing a single electromagnetic sensor adjacent a point on said transmission line, said sensor being electrically isolated from said transmission line;

applying a high voltage signal to the transmission line to induce an arc at said fault, said arc producing a fault current;

determining whether said arc is located to a first side of said point, or to a second side of said point opposite said first side, said determining comprising:

receiving with said single electromagnetic sensor an electromagnetic field produced by an initial surge of said fault current, said electromagnetic field causing the sensor to produce an electrical signal corresponding thereto;

if said electrical signal has a first polarity, identifying the fault as being positioned to the first side of said point;

if said electrical signal has a second polarity opposite the first, identifying the fault as being positioned to the second side of said point.

8. The method of claim 7 which includes:

repeatedly applying high voltage pulses to the transmission line, producing repeated arcs at said fault, and producing repeated fault currents;

moving the single electromagnetic sensor relative to the transmission line while said high voltage pulses are repeatedly being applied, so the sensor is adjacent different points on the transmission line at different times; and identifying the location of the fault as near the position at which the electrical signal produced by the sensor changes polarity from the first polarity to the second polarity.

9. The apparatus of claim 1 wherein said electromagnetic field detector further includes means for discriminating between an electromagnetic field emanating from a fault current pulse in the faulted cable and electromagnetic fields emanating from currents that result from an applied voltage that causes the fault to arc.

10. The apparatus of claim 9 in which the electromagnetic field detector includes amplitude discrimination means for discriminating high current fast rise time pulses.

11. The apparatus of claim 9 in which the electromagnetic field detector includes frequency discrimination means for discriminating high current fast rise time pulses.

12. The apparatus of claim 1 which further includes an indicating device for indicating said direction from said detecting device to said fault.

13. A method for locating an arcing fault on an AC power distribution line from a location remote of the line, the method comprising:

sensing, from a location remote of the line, current pulses passing through a region of the line;

distinguishing an initial current pulse directly associated with a fault current from other current pulses;

detecting a polarity of said initial fault current pulse; and determining, from the detected polarity of the initial fault current pulse, a direction to the fault;

wherein the arcing fault is located by a sensor not physically coupled to the line.

14. The method of claim 13 in which the distinguishing step includes:

integrating the sensed current pulses over a period of time;

attributing as due to reflections those pulses that substantially cancel each other by integration over said period; and attributing as due to a fault current a pulse that is not substantially cancelled by integration over said period.

15. The method of claim 13 which includes:

detecting a current pulse passing through said region of the line; and triggering the integration of current pulses in responses to said detected pulse.

16. The method of claim 15 which includes integrating the current pulses over a period of time sufficient for a pulse to propagate round-trip between said region and a mismatched termination of said line.

17. The method of claim 16 which includes sensing said current pulses by an antenna disposed to receive pulse-induced electromagnetic radiation from the line.

18. The method of claim 13 which includes integrating the current pulses over a period of time sufficient for a pulse to propagate round-trip between said region and a mismatched termination of said line.

19. The method of claim 13 which includes sensing said current pulses by an antenna disposed to receive pulse-induced electromagnetic radiation from the line.

20. In a method of operating a power distribution system, the system including a line for carrying an AC power signal, the system including a device coupled to the line at a point therealong for sensing data relating to the voltage thereat and relating to electromagnetic fields thereat, the device utilizing said sensed data to determine the direction to a cause of an anomaly in said system, an improvement wherein the anomaly is a fault which causes a high amplitude fault current to flow through said line, and in which the method further includes:

positioning a plurality of said devices at a plurality of different points along said line;

generating, at each of said devices, signals corresponding to said sensed electromagnetic fields, and discriminating from said signals a signal produced by an initial surge of the high amplitude fault current;

generating, at each of said devices, data indicating the direction to the fault therefrom; and collecting said data from said plurality of devices to locate the fault;

wherein said logged data memorializes not just the passage of a fault current through said plurality of points, but the direction to the fault, allowing a fault to be located rapidly and without repeated reclosure of system breakers.

21. The method of claim 13 in which the sensing includes sensing with a fixed sensor, and which further includes relaying data produced from said determining step to a remote location.

22. In a method of pinpointing a low impedance arcing fault in a power distribution line, the method including detecting electromagnetic radiation from said power distribution line, an improvement including detecting a positive or negative polarity of an initial fault current to indicate a direction to the fault, said detecting occuring from a location remote from the line.

23. The method of claim 13 in which the detecting step includes providing an electromagnetic radiation sensor, and detecting a polarity of an initial pulse produced therefrom in response to said initial fault current pulse.

24. The method of claim 23 in which the detecting step includes providing an electromagnetic radiation sensor selected from the group consisting of a Hall effect device, a magneto-restrictive device, and a magneto-resistive device.

25. The method of claim 20 which includes relaying said data to a central monitoring station.

26. The method of claim 20 in which said discriminating includes discriminating by reference to amplitude characteristics.

27. The method of claim 20 in which said discriminating includes discriminating by reference to frequency characteristics.

28. The apparatus of claim 3 wherein said electromagnetic field detector further includes means for discriminating between an electromagnetic field emanating from a fault current pulse in the faulted cable, and electromagnetic fields emanating from currents due to application of said high voltage signal.

29. A method of pinpointing a low impedance arcing fault from an underground power distribution line according to claim 22, wherein the detecting includes intercepting electromagnetic fields produced by the initial fault current using an above-ground antenna.

30. An apparatus for locating a fault in a cable, Said cable being isolated from a power distribution system of which it is usually a part, the apparatus comprising:

a signal source coupled to said cable for deliberately applying a large amplitude signal thereto, said signal causing a low impedance arc across the fault, the arc generating a pair of surge current pulses which propagate away from the fault in opposite directions along said cable, one of said pair of surge pulses creating a first electromagnetic field having a first direction, and another of said pair of said surge pulses creating a second electromagnetic field having a second direction; and a receiving device including an electromagnetic field sensor, said first and second electromagnetic fields producing, in said sensor, first and second signals having corresponding first and second polarities, the receiving device further including means responsive thereto for indicating a direction from said receiving device to said fault.

31. The apparatus of claim 30 which further includes means for discriminating between electromagnetic fields due to the applied signal from those due to the surge pulses.

32. The method of claim 13 in which the sensing includes sensing with a movable sensor.

33. The method of claim 13 in which the sensing includes sensing with a fixed sensor.

34. The method of claim 33 in which the line is buried, and which includes burying the fixed sensor with the line.

35. The method of claim 13 which includes inducing a fault on the line by isolating the line from the AC power signal and applying a large amplitude signal to the line.

36. The method of claim 13 in which the fault current is induced by the AC power signal on the line, rather than an externally applied pulse.

37. The method of claim 36 in which the sensing includes sensing with a fixed sensor.

38. In an above-ground method of locating an arcing fault in a buried transmission line, the line being isolated from a power distribution system of which it is normally a part, the method including repeatedly applying high voltage pulses to the line to induce fault current surges to flow at the fault, an improvement comprising locating the fault by reference to a change in orientation of electromagnetic fields produced by said repeated fault current surges when sensed at a plurality of positions along the line.

39. In an apparatus used for locating a fault in a power distribution line by reference to electromagnetic fields emitted therefrom, an improvement comprising discriminator circuitry for discriminating fields due to fault current surges from other fields, and means coupled to said discriminator circuitry for indicating direction to the fault relative to said apparatus.

40. The method of claim 13 in which the sensing comprises indirectly sensing.

41. The method of claim 13 which includes distinguishing the initial fault current pulse by amplitude characteristics thereof.

42. The method of claim 13 which includes distinguishing an initial fault current pulse by frequency characteristics thereof.

43. The method of claim 13 in which the detecting step includes providing a signal related to said initial fault current pulse, and applying said signal to two logic devices, one of which devices responds if said signal has a first polarity, and the other of which devices responds if said signal has a second polarity.

44. The method of claim 13 in which the sensing includes sensing with a fixed sensor, and which further includes storing data produced from said determining step in a memory.

* * * * *